(12) United States Patent
Derner et al.

(10) Patent No.: US 7,174,477 B2
(45) Date of Patent: Feb. 6, 2007

(54) ROM REDUNDANCY IN ROM EMBEDDED DRAM

(75) Inventors: Scott Derner, Boise, ID (US); Casey Kurth, Eagle, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 10/357,779

(22) Filed: Feb. 4, 2003

(65) Prior Publication Data

US 2004/0153725 A1 Aug. 5, 2004

(51) Int. Cl.
*G06F 11/00* (2006.01)

(52) U.S. Cl. ............... 714/7; 714/6; 714/710

(58) Field of Classification Search ........... 714/6, 714/7
See application file for complete search history.

(56) References Cited

U.S. PATENT DOCUMENTS

| | | | |
|---|---|---|---|
| 4,575,819 A | 3/1986 | Amin | |
| 4,744,060 A * | 5/1988 | Okajima | ............. 365/200 |
| 4,855,803 A | 8/1989 | Azumai | |
| 4,878,220 A * | 10/1989 | Hashimoto | ............. 714/703 |
| 5,053,648 A | 10/1991 | van den Elshout | |
| 5,148,391 A | 9/1992 | Zagar | |
| 5,270,241 A | 12/1993 | Dennison | |
| 5,351,213 A | 9/1994 | Nakashima | |
| 5,388,076 A * | 2/1995 | Ihara | ............. 365/200 |
| 5,418,739 A | 5/1995 | Takasugi | |
| 5,523,974 A * | 6/1996 | Hirano et al. | ............. 365/200 |
| 5,732,013 A | 3/1998 | Von Basse | |
| 5,757,690 A | 5/1998 | McMahon | |
| 5,831,892 A | 11/1998 | Thewes | |
| 5,883,903 A * | 3/1999 | Higashitani | ............. 714/710 |
| 5,900,008 A | 5/1999 | Akao | |
| 5,913,928 A * | 6/1999 | Morzano | ............. 714/710 |
| 5,917,744 A | 6/1999 | Kirihata | |
| 5,923,672 A * | 7/1999 | Roberts et al. | ............. 714/710 |
| 5,961,653 A | 10/1999 | Kalter | |
| 5,966,315 A | 10/1999 | Muller | |
| 5,982,682 A | 11/1999 | Nevill | |
| 5,995,409 A | 11/1999 | Holland | |
| 6,052,798 A * | 4/2000 | Jeddeloh | ............. 714/8 |
| 6,065,141 A * | 5/2000 | Kitagawa | ............. 714/711 |
| 6,097,649 A | 8/2000 | Chiang | |
| 6,128,225 A | 10/2000 | Campardo | |
| 6,134,137 A | 10/2000 | Kurth | |
| 6,154,864 A | 11/2000 | Merritt | |
| 6,243,285 B1 | 6/2001 | Kurth | |
| 6,553,556 B1 * | 4/2003 | Blodgett | ............. 716/17 |
| 6,657,878 B2 * | 12/2003 | Lien et al. | ............. 365/49 |
| 6,735,727 B1 * | 5/2004 | Lee | ............. 714/711 |
| 6,826,712 B2 * | 11/2004 | Ono | ............. 714/6 |
| 7,028,234 B2 * | 4/2006 | Huckaby et al. | ............. 714/710 |
| 7,043,672 B2 * | 5/2006 | Merritt | ............. 714/711 |
| 2002/0141254 A1 * | 10/2002 | Ladner et al. | ............. 365/200 |
| 2004/0073824 A1 * | 4/2004 | Machida | ............. 713/323 |

* cited by examiner

*Primary Examiner*—Scott Baderman
*Assistant Examiner*—Joshua Lohn
(74) *Attorney, Agent, or Firm*—Leffert Jay & Polglaze, P.A.

(57) ABSTRACT

Redundancy in a read only memory (ROM) embedded dynamic random access memory (DRAM) is accomplished by programming redundancy elements such as antifuses or registers with ROM data which is read instead of erroneous data. Multiple identical arrays of ROM bits can also be used for redundancy.

27 Claims, 4 Drawing Sheets

ROM REDUNDANCY IN ROM EMBEDDED DRAM

The present invention relates generally to memory devices, and more specifically to a read only memory (ROM) embedded in a dynamic random access memory (DRAM).

BACKGROUND

DRAM technology builds redundancy into DRAM arrays. Such redundancy allows for reassigning data storage to another redundant row/column/block of a memory array to compensate for inevitable defects in processing. Since modern DRAM arrays are so vastly large in number of cells, and so vastly small in terms of actual size per cell, even small errors in processing can affect cells. By building redundancy into DRAM arrays, yield is improved since reprogramming of some portion of a DRAM array is far superior to wasting the entire part due to a few small defects. Since the defect rate is actually not very large, a single redundancy array is sufficient to compensate for most errors in processing of a modern DRAM array.

In redundancy in DRAM arrays, spare elements such as rows or columns are used as logical substitutes for a defective element or elements. The substitution of redundant rows or columns for defective rows or columns is controlled by a physical encoding scheme. As memory density and size increase, redundancy becomes more and more important. Row and column redundancy are commonplace in modern DRAMs. Further, some DRAM manufacturers have begun to experiment with entire subarray redundancy.

Row redundancy replaces bad word lines with good word lines. Any number of problems could exist on word lines, including shorted or open word lines, word line to digit line shorts, bad transistors or storage capacitors, and the like.

A ROM embedded DRAM is a DRAM array that has been modified slightly to allow for a portion of the DRAM array cells to be converted into ROM cells. Such a ROM embedded DRAM is described in greater detail in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to $V_{cc}$ or $V_{ss}$ by shorting the cell to word lines. The memory reads the ROM cells in a manner that is identical to reading the DRAM cells.

In a ROM embedded DRAM, problems with DRAM cells that have been converted to ROM cells can contribute to ROM defects. For example, if a DRAM cell on a portion of the ROM embedded DRAM is to be programmed by hard shorting to a 0 logic, but it is open and stuck at a 1 logic, there would be an error.

In row redundancy, when a row address is strobed into a DRAM, the address is compared to a known bad address bank. If a bad address is requested, a replacement word line is fired in place of the defective or bad word line. The replacement word line can appear anywhere on the DRAM array. Repair of rows is termed either global or local. If the replacement word line is in the same subarray as the bad word line, the repair is termed a local repair. If the bad word line is in a different subarray than the replacement word line, the repair is termed a global repair. Global repair is more desirable because the amount of repair is limited in each subarray. If one particular subarray has a large number of defects, and all the repairs are local, the subarray could run out of available replacement rows, and the entire chip becomes scrap. Global repair is very effective for cluster type failures, and is especially helpful for larger DRAMs.

There are many different redundancy repair schemes, which are beyond the scope of this application, but which are readily known to those of skill in the art. For example only and not by way of limitation, repair schemes include antifuses, dynamic logic, and the like. Redundant word lines are often capable of pretesting to determine whether they are good or bad before actual selection of the replacement word line. This allows for selection of a good replacement word line and the concordant lack of necessity to change many replacement word lines to second replacement word lines.

Column redundancy schemes are also available on most modern DRAMs. Column redundancy differs from row redundancy in that it is often the case that column addresses can be accessed multiple times per row address strobe cycle. Each column is held open until a subsequent column appears. Typical column fuse blocks for column redundancy are built using static logic gates rather than dynamic logic gates. Dynamic gates require a precharge and evaluation (P&E) and sufficient time to perform the P&E may not be present with unpredictable column addressing. In some modern DRAMs, such P&E will work, and in that case, the schemes for column redundancy are very close to that of row redundancy. However, in some other DRAM architectures, static redundancy is used.

It would be desirable to implement redundancy in the ROM portion of a ROM embedded DRAM.

SUMMARY

In one embodiment, a ROM embedded DRAM includes a memory array having a first portion of ROM bits and a second portion of DRAM bits, a storage element containing row and column addresses, and ROM bit polarity data for each defective ROM bit, compare circuitry to compare the address of each ROM bit data with its corresponding storage element data, and a redundancy compare circuit to redirect incorrect ROM bit data to the storage element data that contains correct data for that ROM bit.

In another embodiment, a ROM embedded DRAM includes a ROM embedded DRAM array having a ROM portion and a DRAM portion, wherein the ROM portion comprises first and second identical ROM bit subarrays, a storage element to store defective ROM bit column address, row address, and correct polarity data for each ROM bit, and a redundancy element to point to the second subarray containing correct ROM data if a predetermined portion of the first subarray is defective.

In yet another embodiment, a method of repairing ROM bit errors in a ROM embedded DRAM includes storing defective ROM bit row and column address and correct ROM bit polarity for each defective ROM bit into a redundancy storage element, determining whether the live array ROM bit data is correct, and correcting the live array ROM bit data if the live array ROM bit data and the redundancy stored data are different.

In still another embodiment, a method of repairing a ROM section of a ROM embedded DRAM includes encoding at least two identical ROM sections in a ROM embedded DRAM, storing ROM bit data including row address, column address, and the sections containing the correct ROM data, identifying defective ROM bits in the ROM sections, and routing read requests for a defective ROM bit in the first section to its corresponding correct bit in the second ROM section.

In still another embodiment, a method of operating a ROM embedded DRAM includes programming a ROM embedded DRAM with a DRAM portion and a ROM portion, and copying the ROM bits to the DRAM section upon initialization of the ROM embedded DRAM.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

The following detailed description is, therefore, not to be taken in a limiting sense, and the scope of the present invention is defined only by the appended claims, along with the full scope of equivalents to which such claims are entitled.

Figure 1:
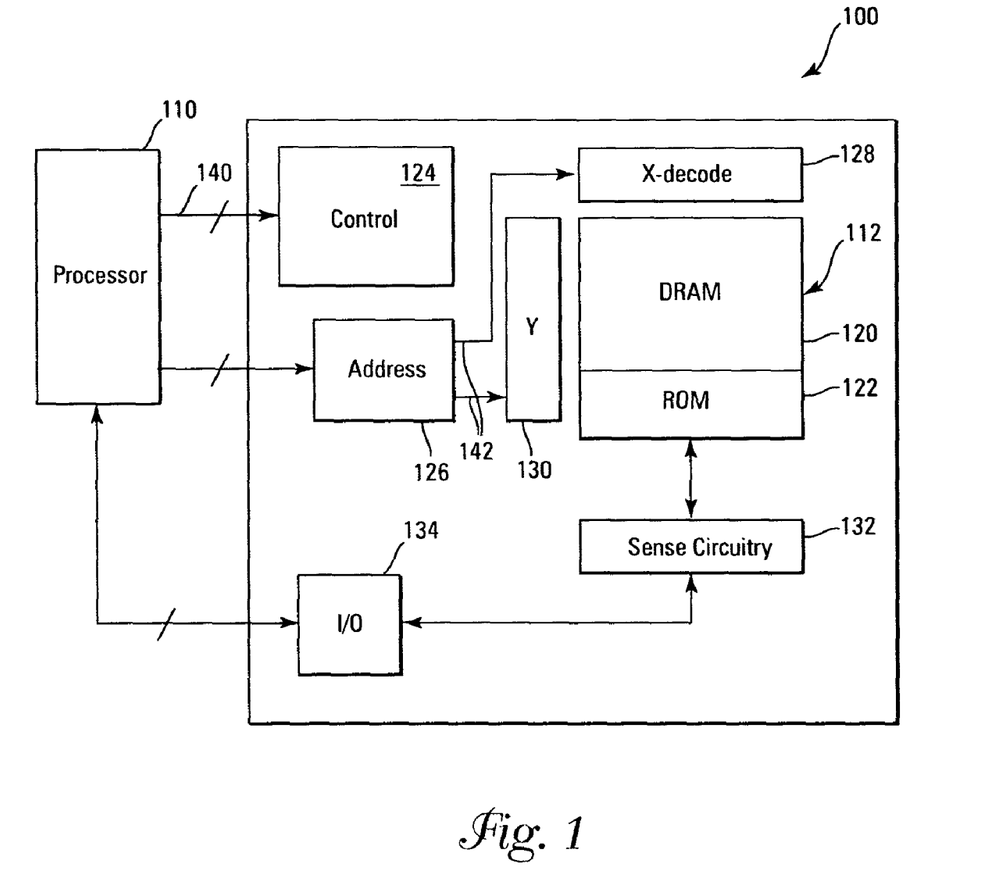
FIG. 1 is a block diagram of a ROM embedded DRAM on which embodiments of the present invention are practiced.

A ROM embedded DRAM is a DRAM array having a portion of the array utilized as a ROM array, and another portion of the array used as a normal DRAM array. Referring to FIG. 1, a simplified block diagram of a ROM embedded DRAM 100 of the present invention is described. The memory device can be coupled to a processor 110 for bidirectional data communication. The memory includes an array of memory cells 112. The array includes a dynamic (DRAM) portion 120 and a read only (ROM) portion 122. The ROM array is "embedded" in the dynamic memory and may include some dynamic cells. Control circuitry 124 is provided to manage data storage and retrieval from the array in response to control signals 140 from the processor. Address circuitry 126, X-decoder 128 and Y-decoder 130 analyze address signals 142 and storage access locations of the array. Sense circuitry 132 is used to read data from the array and couple output data to I/O circuitry 134. The I/O circuitry operates in a bi-directional manner to receive data from processor 110 and pass this data to array 112. It is noted that the sense circuitry may not be used in some embodiments to store the input data.

Dynamic memories are well known, and those skilled in the art will appreciate that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory. As described below, the present invention provides an improved ROM embedded DRAM having ROM portion redundancy.

ROM bits are hard programmed in a ROM embedded DRAM by any number of programming techniques, including by way of example only and not by way of limitation, hard programming by eliminating cell dielectric to short cell plates to a program voltage, or by fabricating an electrical plug between the cell plates and shorted to a program voltage, programming using an anti-fuse programming technique, or by providing a high leakage path (not full short) such as through an active area to the substrate.

There is an advantage in building in redundancy in a ROM when it is fabricated as a ROM embedded DRAM. Since there are so many possible small defects that can crop up among the many millions of devices on a typical sized ROM embedded DRAM or DRAM chip, it is beneficial to allow for some repair. Typically, this is done through redundancy. The repair embodiments of the present invention range from repair of everything from a single bit up to an entire array.

Instead of testing to determine errors as in DRAM technology, it is necessary to check to see if the ROM bit of the ROM embedded DRAM contains data to which it has been programmed, that is either a 1 or a 0, statically.

In order to accomplish this, several different embodiments are shown. Repairs on ROM embedded DRAM can be performed in the various embodiments on any number of bits from a single bit repair to an entire subarray repair.

Figure 2:
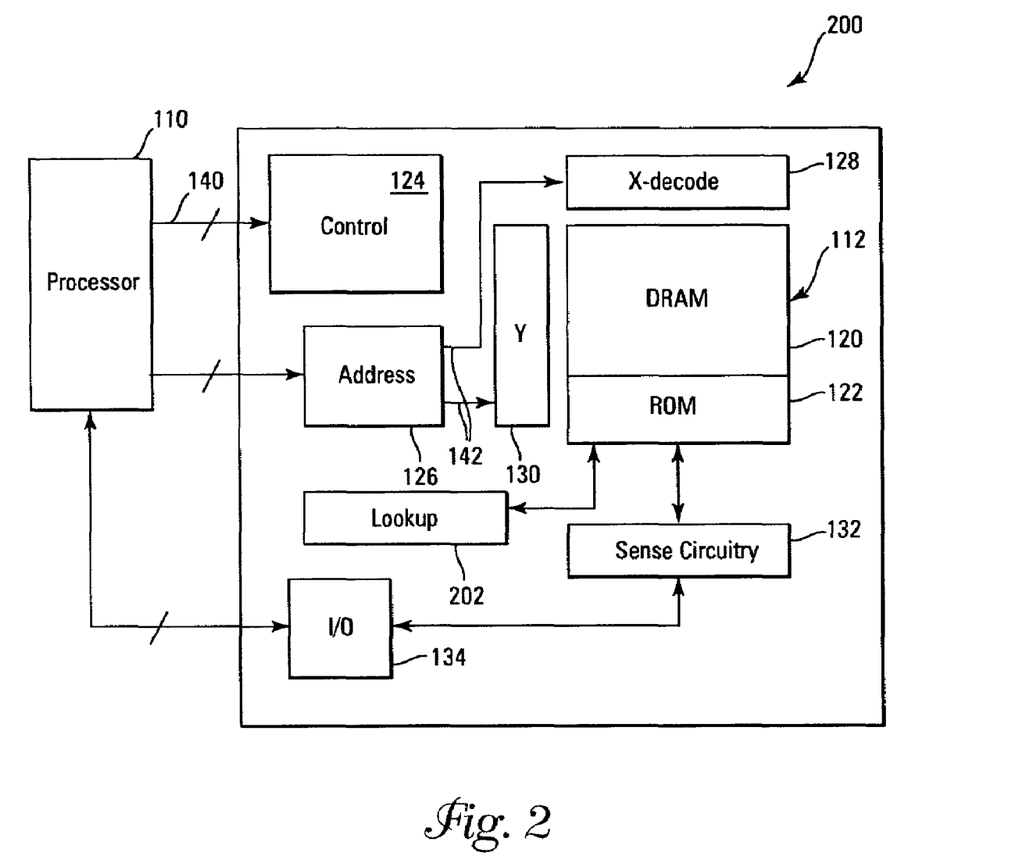
FIG. 2 is a block diagram of a ROM embedded DRAM according to one embodiment of the present invention.

A ROM embedded DRAM 200 having ROM portion redundancy is shown in one embodiment in FIG. 2. The standard ROM embedded DRAM is modified in this embodiment by adding a register or lookup table 202 which is capable of bi-directional communication with the address circuitry and the ROM, and in another embodiment the processor. During programming of the ROM portion of the ROM embedded DRAM, the lookup table or other information storage array is generated. The lookup table contains row and address information for each of the ROM bits in the ROM portion of the ROM embedded DRAM which is determined to be defective, and also contains the correct polarity, that is the value (1 or 0) that the defective ROM bit is supposed to hold.

Upon checking of the ROM portion after the programming of the ROM portion is completed, any ROM bits which are not properly programmed are identified by row address and column address. The bad or defective row and column addresses are stored in a register, bank of antifuses, or the like, and when a row and address for reading is presented to the ROM portion of the ROM embedded DRAM via the address circuitry, the received addresses are checked against the table, register, or bank of known bad addresses. If a match is found between the received addresses and the bad address lookup, the request for the data at the bad address is rerouted to the lookup table 202 containing the proper ROM bit for the received address. This ROM bit is read out as the requested ROM bit. In one embodiment, the lookup table 202 includes not only the row, address, and polarity information, but also the bad row and address information. In another embodiment, the lookup table and the bad address register are separate.

In operation, the lookup table or redundancy register contains all the normal circuitry of a redundancy array, but also contains an extra bit to store correct ROM bit polarity. During testing, bad addresses are determined, and stored in the lookup table along with the correct ROM bit polarity that is supposed to be stored in the cell at the received row and column address. The ROM bit is simply an extra bit which is programmed along with the row and column address when a particular ROM bit is determined during testing to be defective. Redundancy circuitry in another embodiment comprises a defective ROM bit address register and a defective ROM bit address bank.

The bits of such a redundancy compare circuit are typically programmed using antifuses. When the address circuitry determines that a defective row and column address has been received, the address circuitry looks up the address in the lookup table, and uses the programmed correct polarity bit in the lookup table as the data to be read out from the ROM. It should be understood that the size of the redundancy compare circuit or lookup table can be varied without departing from the scope of the invention. For example, the redundancy compare circuit or lookup table is made larger in another embodiment. The only factor limiting size of the redundancy compare circuit or lookup table is real estate available.

Various redundancy schemes are appropriate for the rerouting of bad addresses once the bad addresses are known. The provision in a lookup table such as lookup table 202 of the appropriate ROM bits allows redundancy in the live array ROM portion of the ROM embedded DRAM without the need for actually having redundant cells. Instead, the table contains the pertinent correct ROM bit information, which is read out when there is an error or defect in the live array ROM portion of the ROM embedded DRAM. In an alternative embodiment, correcting the ROM bit data is accomplished by inverting the read ROM bit polarity for a known defective ROM bit prior to sending the data to an output pin of the memory device.

In another embodiment, only ROM bits which are to be hard shorted to a specific polarity are checked, with the remaining ROM bits assumed by address to be the opposite polarity. In other words, the ROM portion of the ROM embedded DRAM is programmed so that all of the bits to be hard shorted to a certain polarity, say 0, are hard shorted to zero logic, and then checked to see if any errors occurred on those bits. The remaining ROM bits of the ROM embedded DRAM, namely those bits which are to be 1 polarity bits, are assumed by software, hardware, or firmware to be 1 bits. This reduces the size of the lookup table needed for the ROM portion of the ROM embedded DRAM, but may increase the complexity of software, hardware or firmware used in decoding the ROM bits.

In another embodiment, a ROM embedded DRAM array has an array of antifuses that are used for redundancy in the array as described above. Upon testing in a DRAM, for example, if a row or column of the DRAM is found to be bad, that row or column is routed to a redundant set of elements for execution of the memory storage desired. This is done, as described above, by programming antifuses or the like to replace a designated row address with a new destination row address. In one embodiment of the present invention, an array of antifuses is used similarly to the use in a typical DRAM. However, in the case of a ROM embedded DRAM, the necessary information for each bit includes not only a row and a column address, but also a polarity of the ROM bit to be decoded. In other words, each ROM bit is identified by a row address and a column address, and also by a polarity of the ROM bit, that is a 1 or a 0 value. This information is stored in a register or the like so as to be readily available when a bad row and column address is received.

On a ROM embedded DRAM, a test is run to check the encoding of the ROM section. When testing is complete, the necessary rerouting of rows, columns, bits and the like is known, and is then performed. This is accomplished in various embodiments following typical DRAM redundancy reprogramming for defective rows and columns or addresses, with the added process of encoding or pointing to information pertaining to the sections containing the correct ROM data as well as the row and column address of the ROM bit.

In a normal DRAM, the programming of an antifuse leads to the rerouting of a row or column to a redundant row or column of memory bits. In this embodiment, it is not necessary to reroute to a redundant column or row of memory bits. Instead, what is done by blowing the antifuse in an antifuse redundancy scheme is to reroute to a lookup table, register, bank of antifuses, or the like, such as lookup table 202, that is programmed to look up or is encoded with the row and column address of the ROM bits, as well as the polarity of the ROM bits.

In one embodiment, the lookup is made in a bank of antifuses. The bank of antifuses has a register, wherein each of the antifuses corresponds to a particular row and column address, and is registered at each row and column address, that is at each and every defective ROM bit, with the polarity of the specific ROM bit that matches the row and column address that is desired to be accessed.

In this embodiment, the ROM has been described as if it were programmed at a manufacturing facility, that is not field programmed. For example, a mask for making the ROM is coded with the desired ROM hard wiring information, and is encoded in the manufacturing process. Once the ROM is encoded, it is tested. If errors occur, they are repaired using one of the redundancy techniques discussed above. The repair is performed in one embodiment by blowing the antifuse in the redundancy part of the ROM that corresponds to the bit which has an error so that it reads correctly.

In this embodiment, the ROM has been discussed with hard coded ROM programming, that is programming done at the manufacturing location. However, it should be understood that field programmable ROMs (PROMs) are used in another embodiment. In that embodiment, the field programmer field programs a ROM as PROMs are typically programmed. Then, testing is performed. At that point, the customer or field programmer must know the redundancy scheme in order to effect repairs on the ROM embedded DRAM ROM portion.

Figure 3:
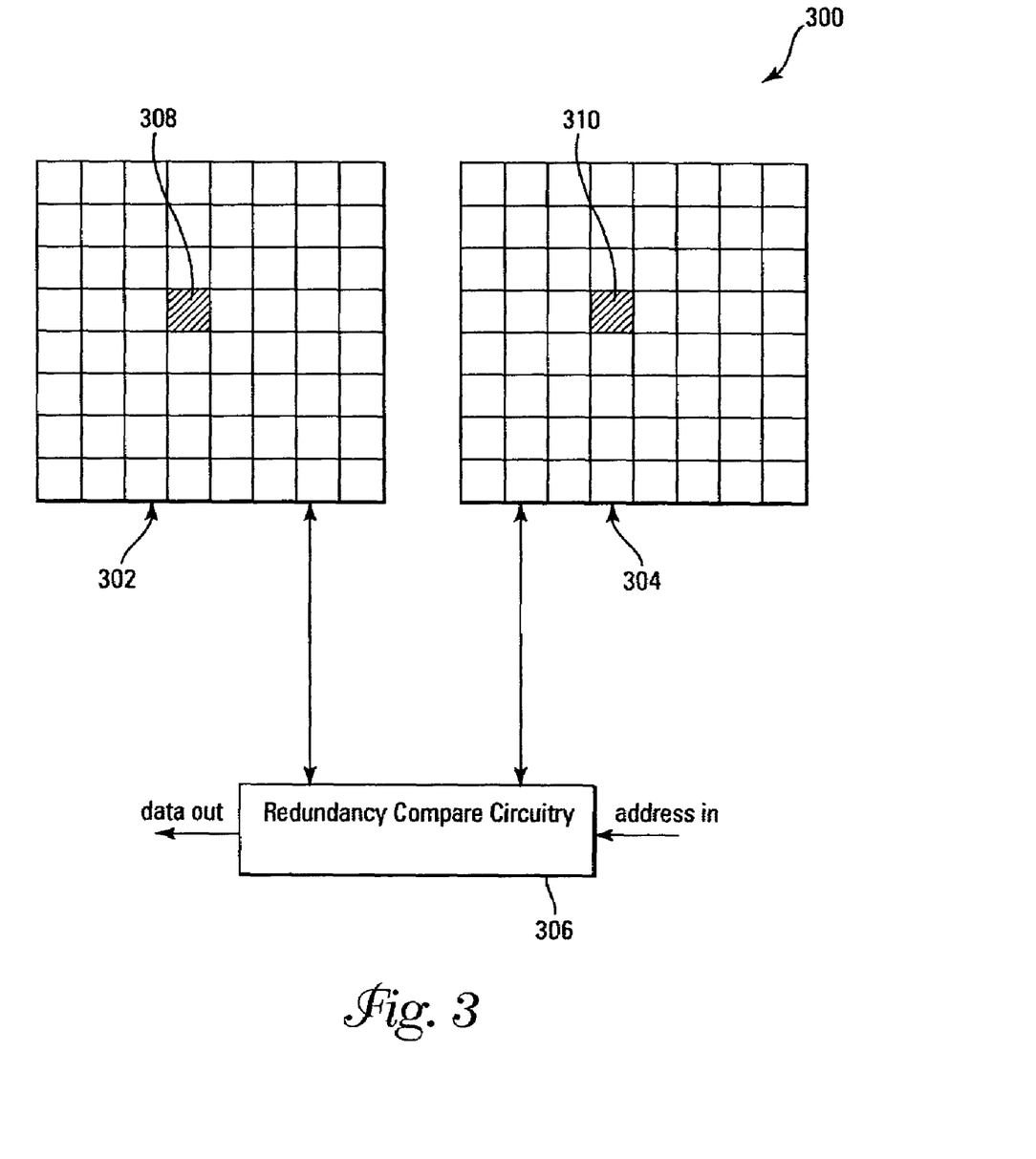
FIG. 3 is a block diagram of a ROM embedded DRAM according to another embodiment of the present invention.

In another embodiment 300 shown in block diagram in FIG. 3, two identical banks of ROM embedded DRAM ROM cells 302 and 304 are created. At the time of programming, each ROM bit is programmed to each array, primary array 302 and secondary array 304, and to a redundancy compare circuit 306, with its polarity and row and address location. Upon testing, the row and address are determined, and the value in the memory cell at the received row and address is compared to the value of the polarity stored in the redundancy compare circuit. If the actual bit value in addressed location of the primary array 302 does not match the stored bit value, then the row and address are redundantly programmed to look up the same row and address in the redundant or secondary array 304. Only if each of the arrays 302 and 304 contains an identical bit error will a problem arise.

The redundancy scheme of FIG. 3 allows for the repair of errors from a single bit up to and including an entire array, provided the errors in the arrays do not overlap. For example, each of arrays 302 and 304 are encoded with the same ROM bit mask in a ROM embedded DRAM programming. At the time of programming, the redundancy compare circuit 306 is also encoded or programmed with the row and address information and ROM bit polarity of each of the ROM bits in the arrays. Arrays 302 and 304 are identical without errors. A received address indicates the location of the ROM bit 308 of array 302 whose value is desired to be read. The value read out from the cell 308 is compared in the redundancy compare circuit to the desired value. If the values match, the data is read out of cell 308 to the data out and operation continues as normal. If on the other hand, the values do not match, the redundancy compare circuit points the particular received row and address to the secondary array 304 cell 310 which is masked to be programmed identically to cell 308 of array 302. If the value on the redundancy compare circuit and the secondary array match, the value of cell 310 is read out of cell 310 and operation continues as normal.

In this manner, individual bit errors are repaired in redundant array fashion. It should be seen that not only are individual bit errors repairable using the redundancy configuration of FIG. 3, but also bit errors on a larger scale are repairable. For example, the arrays 302 and 304 are in another embodiment subdivided into smaller subarrays. If errors occur in a subarray of the primary ROM embedded DRAM ROM array 302, the bad subarray addresses are pointed to corresponding subarray locations of the secondary array 304. Repair schemes according to this embodiment are amenable to repair of rows, columns, individual bits, blocks, and the like.

In another example of operation of such a redundancy configuration, the ROM embedded DRAM 300 has enough memory bits to make at least two images of a desired ROM portion of the ROM embedded DRAM. For example, a customer desires 64 MB of DRAM and 32 MB of ROM on the same chip. In this instance, a 128 MB ROM embedded DRAM can be programmed to have 64 MB of DRAM, and two arrays of 32 MB of ROM. Each of the two arrays of ROM in this embodiment are identical images of one another. The ROM sections are programmed with the desired information that the customer wishes to have programmed in the ROM section. Then, once the programming is performed, the ROM arrays are tested to determine if any errors exist. If an error is found in the primary ROM section, the bad section, be it a single bit, a row, a column, a subarray, a block, or even the entire array, is mapped to the secondary array. Identification of bad bits, segments, and the like is accomplished in various ways, for example only and not by way of limitation, using fuse banks, antifuse banks, or registers. When blown, an antifuse reroutes a specific row and column location, or an entire subarray or the like, of the primary ROM array to the same location on the secondary ROM array.

In yet another embodiment, blocks of any size from an individual bit on up to an entire ROM section of a ROM embedded DRAM are redundantly repairable. If ever increasing amounts of reliability are required, the number of redundant blocks is in other embodiments increased. For example, in a 256 MB DRAM chip, perhaps the customer only wishes to have 64 MB of RAM, and the rest of the chip is available for ROM embedded in the DRAM, then 192 MB is available for ROM. In many cases, the amount of ROM desired is actually quite low, for example 32 MB. In this instance, six 32 MB arrays are formed to allow for greatly increased multiple redundancy for the ROM portion of the ROM embedded DRAM. It should be seen that the actual configuration of the amount of redundancy will vary depending upon the desired yield of DRAM versus ROM for the ROM embedded DRAM, and for the level of redundancy desired in the configuration.

In another embodiment, a combination of other embodiments comprises first and second identical arrays as in FIG. 3, and further redundancy on the second array as in FIG. 2. Such a configuration, for its limited value, is less desirable since the extra logic and space allowed are generally more useful in other endeavors.

However, in a situation in which there is enough room for redundancy but not enough for an entire second array, such a combination provides an extra measure of reparability to the chip. For example, if a ROM embedded DRAM chip has enough room for the customer's desired DRAM/ROM configuration, with enough leftover room for a redundant ROM array image, and for a redundancy scheme of antifuses for one of the ROM subarrays but not both, such a combination provides extra reparability without sacrificing usability.

In another embodiment, testing of the ROM portion of the ROM embedded DRAM identifies the predominant type of error in the ROM portion of the ROM embedded DRAM. The redundant array is broken into segments or chunks according to the predominant type of error. For example, if the predominant error type is single bit errors, the redundant array is subdivided into individual bits. If the predominant error type is blocks, the redundant array is subdivided into blocks of a determined size, and reprogramming is of blocks instead of individual bits.

In yet another embodiment, the specific fabrication process may lend itself to have predominantly a specific type of error. A redundant ROM array is divided in this embodiment into subarrays according to the likely type of errors. Software built into ROM programming in another embodiment allows the redundant array to be subdivided after testing according to a predominant type of error found during testing.

A ROM embedded DRAM having a section of ROM programmed bits and a section of DRAM bits is advantageously used in certain situations in which non-volatile memory is desired or required, but where speed is also a factor. In such a situation, a ROM embedded DRAM has the contents of the ROM section read into RAM on startup or trigger. The ROM portion is then no longer needed, as all operations are performed using the ROM copied into RAM. That is, a ROM to RAM copy, allowing the ROM to be modified while maintaining the integrity of the ROM encoding for later use. Such an embodiment is especially useful in situations where the ROM read is a long process, or the ROM consumes more power than is desired to be consumed if read multiple times. Such an embodiment is useful in configurations where real estate is a primary concern. In such situations, a single chip having both ROM and DRAM sections is employed, thereby using only one chip instead of the usual two chips. For example, hearing aids, cellular telephones, and other size constrained apparatuses, are amenable to the embodiments of the present invention.

In yet another embodiment, ROM embedded in DRAM is read into RAM on startup to allow for faster operation of the ROM portion of the DRAM. For example, it may be desirable in one embodiment to program certain startup options which will always remain the same into ROM. However, ROM typically runs slower than RAM. In this instance, during startup, the contents of the ROM portion of the ROM embedded DRAM are read into RAM so that they can be executed with greater speed. This also allows for the possibility of changing the ROM parameters temporarily, knowing that upon another restart, the original ROM encoding will again be available.

Figure 4:
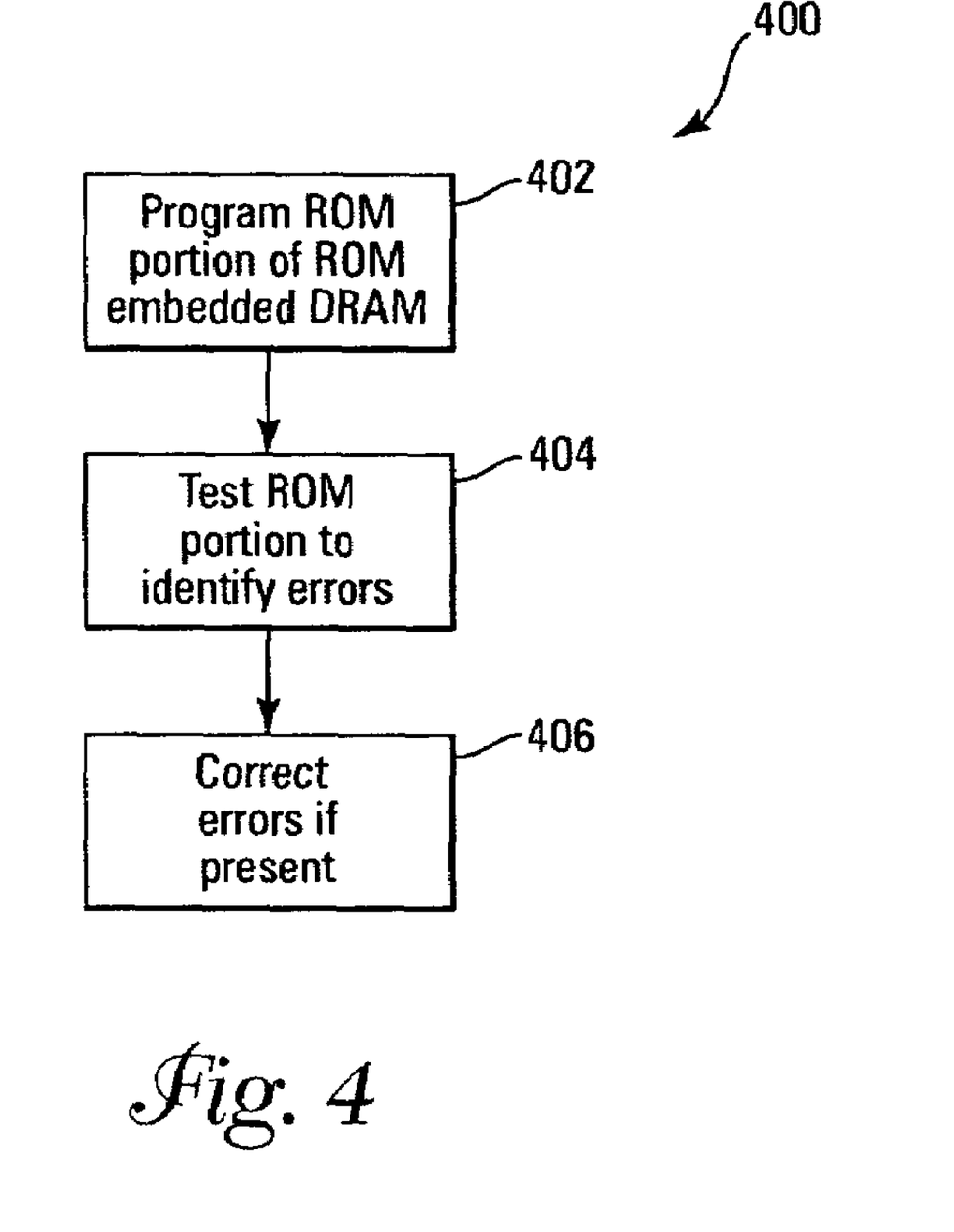
FIG. 4 is a flow chart diagram of a method according to one embodiment of the present invention.

A method 400 of redundancy testing in a ROM embedded DRAM is shown in flow chart diagram in FIG. 4. Method 400 comprises programming the ROM portion of the ROM embedded DRAM in block 402, and testing the ROM portion of the ROM embedded DRAM to identify errors in the ROM portion in block 404. If errors are detected, they are corrected in block 406. The fixing of errors is accomplished in one of numerous ways as described above in the various embodiments. For example only, and not by way of limitation, the ROM errors are corrected by identifying bad row and column addresses, and rerouting ROM reads to a lookup table for bad addresses, the lookup table, such as lookup table 202 as described above, containing not only the row and column address, but also the polarity for each ROM bit, programming an antifuse array for redundancy, and rerouting bad addresses to an entirely different but identically programmed array. Redundancy configurations of this type allow the repair of individual bits on up to an entire ROM embedded DRAM ROM section.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A ROM embedded DRAM, comprising:
a memory array having a first portion of ROM bits and a second portion of DRAM bits;
a storage element containing row and column addresses of each defective ROM bit, and correct ROM bit polarity data for each defective ROM bit correlated to each ROM bit;
compare circuitry to compare the address of each ROM bit data with its corresponding storage element data; and
a redundancy compare circuit to redirect incorrect ROM bit data to the storage element data that contains correct ROM bit polarity data for that ROM bit.

2. A ROM embedded DRAM, comprising:
a memory array having a first portion of ROM bits and a second portion of DRAM bits;
a storage element containing row and column addresses of defective ROM bits, and correct ROM bit polarity data for each defective ROM bit;
compare circuitry to compare the address of each ROM bit data with its corresponding storage element data; and
a redundancy compare circuit to redirect incorrect ROM bit data to the storage element data that contains correct ROM bit polarity data for that ROM bit, wherein the storage element is a bank of antifuses.

3. A ROM embedded DRAM comprising:
a ROM embedded DRAM array having a ROM portion and a DRAM portion;
a storage element to store defective ROM bit column addresses, row addresses, and correct polarity data for each ROM bit;
a compare element to determine whether a received row and column address is defective; and
an antifuse array programmed to provide the correct ROM bit polarity data when a row and column address for a defective ROM bit is received in a read operation.

4. A ROM embedded DRAM comprising:
a ROM embedded DRAM array having a ROM portion and a DRAM portion;
wherein the ROM portion comprises first and second identical ROM bit subarrays;
a storage element to store defective ROM bit column address, row address, and correct polarity data for each ROM bit with the row and column address correlated to the correct polarity for each ROM bit; and
a redundancy element to point to the second subarray containing correct polarity data if a predetermined portion of the first subarray is defective.

5. The ROM embedded DRAM of claim 4, wherein the predetermined portion is an individual bit.

6. The ROM embedded DRAM of claim 4, wherein the predetermined portion is a row.

7. The ROM embedded DRAM of claim 4, wherein the predetermined portion is a column.

8. The ROM embedded DRAM of claim 4, wherein the predetermined portion is a block.

9. A method of repairing ROM bit errors in a ROM embedded DRAM, comprising:
storing defective ROM bit row and column address and correct ROM bit polarity data correlated to each row and column address for each defective ROM bit into a redundancy storage element;
determining whether a live array ROM bit data is correct; and
correcting the live array ROM bit data if the live array ROM bit data and the redundancy stored data are different.

10. The method of claim 9, wherein determining whether the ROM bit data is correct comprises comparing its data to the storage element data.

11. The method of claim 9, wherein correcting the ROM bit data comprises inverting the read ROM bit polarity prior to sending the data to an output pin.

12. The method of claim 9, wherein correcting the ROM bit data comprises providing the storage element ROM polarity instead of the ROM bit polarity in a read operation.

13. The method of claim 9, wherein storing further comprises storing row and column addresses of determined defective ROM bits.

14. The method of claim 13, wherein correcting comprises providing the storage element ROM polarity when a determined defective row and column address combination is received.

15. A method of repairing a ROM section of a ROM embedded DRAM, comprising:
encoding at least two identical ROM sections in a ROM embedded DRAM;
storing ROM bit data including defective row addresses, defective column addresses, and a correct ROM bit polarity for each ROM bit corresponding to the defective row addresses and defective column addresses in the at least two identical ROM sections in a redundancy compare circuit;
identifying defective ROM bits in the ROM sections; and
routing read requests for a defective ROM bit in a first ROM section of the at least two identical ROM sections to its corresponding correct bit in a second ROM section of the at least two identical ROM sections.

16. The method of claim 15, wherein identifying defective ROM bits further comprises determining a predominant error type in the ROM sections.

17. The method of claim 15, wherein repairing further comprises blowing an antifuse to enable reading of the second section ROM bit for a defective first section ROM bit.

18. The method of claim 15, and further comprising: subdividing the ROM sections according to a predetermined predominant error.

19. The method of claim 18, wherein the predominant error is selected from a group consisting of single bit errors, row errors, column errors, and block errors.

20. A method of operating a ROM embedded DRAM, comprising:
   programming a ROM embedded DRAM with a DRAM portion and a ROM portion; and
   copying the ROM bits to the DRAM section upon initialization of the ROM embedded DRAM, wherein copying the ROM bits to the DRAM section comprises, in the event of one or more defective ROM bits, copying a correct ROM bit polarity for each defective ROM bit from a storage element that also contains a bit row and column address of each defective ROM bit correlated to the polarity of the ROM bit.

21. The method of claim 20, and further comprising: modifying the copied ROM bits in DRAM to perform operations thereon.

22. The method of claim 20, and further comprising: correcting errors on the ROM bits prior to copying.

23. The method of claim 22, wherein correcting errors comprises:
   programming a ROM section of a ROM embedded DRAM;
   storing ROM bit row and column address and correct ROM bit polarity for each defective ROM bit into the storage element;
   determining whether the ROM bit data is correct; and
   correcting the ROM bit data if the ROM bit data and the stored data are different.

24. A ROM embedded DRAM, comprising:
   a ROM array and a DRAM array;
   address circuitry for addressing the ROM array; and
   a redundancy compare circuit operatively connected to allow redundancy in the ROM array, the redundancy compare circuit comprising:
      a defective ROM bit address register that stores the row and column address of each defective ROM bit; and
      a defective ROM bit address data bank that stores the correct bit polarity of each defective ROM bit correlated to the address register data for each ROM bit.

25. A ROM embedded DRAM, comprising:
   a ROM array and a DRAM array;
   address circuitry for addressing the ROM array; and
   a redundancy compare circuit operatively connected to allow redundancy in the ROM array, the redundancy compare circuit comprising:
      a defective ROM bit address register that stores the row and column address of each defective ROM bit; and
      a defective ROM bit address data bank that stores the correct bit polarity of each defective ROM bit, wherein the defective ROM bit address register and the defective ROM bit address data bank comprise a bank of antifuses programmed to output proper ROM bit data for defective addresses.

26. A ROM embedded DRAM, comprising:
   a ROM array and a DRAM array;
   address circuitry for addressing the ROM array; and
   a redundancy compare circuit operatively connected to allow redundancy in the ROM array, the redundancy compare circuit comprising:
      a defective ROM bit address register that stores the row and column address of each defective ROM bit; and
      a defective ROM bit address data bank that stores the correct bit polarity of each defective ROM bit, wherein the defective ROM bit address register comprises a bank of antifuses to store a plurality of defective row and column addresses.

27. A ROM embedded DRAM, comprising:
   a ROM array and a DRAM array;
   address circuitry for addressing the ROM array; and
   a redundancy compare circuit operatively connected to allow redundancy in the ROM array, the redundancy compare circuit comprising:
      a defective ROM bit address register that stores the row and column address of each defective ROM bit; and
      a defective ROM bit address data bank that stores the correct bit polarity of each defective ROM bit, wherein the defective ROM bit address data bank comprises a plurality of antifuse bits, each antifuse bit corresponding to a polarity of a ROM bit with a row and column address identified as defective.

* * * * *